(12) United States Patent
Brown et al.

(10) Patent No.: US 6,280,839 B1
(45) Date of Patent: Aug. 28, 2001

(54) NONHYGROSCOPIC THERMALLY STABLE ALUMINUM HYDROXIDE

(75) Inventors: Neil Brown, Bergheim (DE); Michael Aggleton, Gloucester (GB)

(73) Assignee: Alusuisse Martinswerk GmbH, Bergheim (DE)

( * ) Notice: Subject to any disclaimer, the term of this patent is extended or adjusted under 35 U.S.C. 154(b) by 0 days.

(21) Appl. No.: 09/316,205

(22) Filed: May 21, 1999

(30) Foreign Application Priority Data

May 29, 1998 (EP) .................................................. 98109925

(51) Int. Cl.[7] ....................................................... B32B 5/16
(52) U.S. Cl. .................. 428/328; 106/18.12; 106/18.26; 428/329; 428/405
(58) Field of Search ..................... 428/403, 323, 428/328, 329, 405; 106/18.26, 18.12

(56) References Cited

U.S. PATENT DOCUMENTS

| 5,139,875 | * | 8/1992 | Metzemacher et al. | ............. 428/403 |
| 6,090,316 | * | 7/2000 | Zhu et al. | ............................ 252/609 |

FOREIGN PATENT DOCUMENTS

| 9700708.2 | 1/1997 | (GB) . |
| 60-203438 | 10/1985 | (JP) . |

* cited by examiner

Primary Examiner—Hoa T. Le
(74) Attorney, Agent, or Firm—Fisher, Christen & Sabol

(57) ABSTRACT

A nonhygroscopic thermally stable aluminum hydroxide, which is particularly useful for the preparation of thermally stable and fire retardant laminates for printed circuit boards.

27 Claims, No Drawings

NONHYGROSCOPIC THERMALLY STABLE ALUMINUM HYDROXIDE

BACKGROUND OF THE INVENTION

1. Field of the Invention

The invention relates to a nonhygroscopic thermally stable aluminum hydroxide and its application in thermally stable fire retardant laminates for printed circuit boards.

2. Background Art

Printed circuit board laminate types are defined by the American NEMA (National Electrical Manufacturers Association) standard; the terminology is accepted worldwide. Generally, laminates are categorized according to the type of reinforcement used, i.e., cellulose paper or glass. Typically, the type FR-2 uses paper only, and CEM-1 uses paper and woven glass, while type CEM-3 contains both woven and non-woven glass. The type FR-4 contains woven glass only.

To achieve the required V0 level of fire retardancy according to American Underwriters Laboratories' standard UL-94, it is necessary to add either fire retardant chemicals to the polymer system or build halogens or phosphorous into the backbone of the polymer itself. On combustion, these additives help to extinguish the fire. However, in the process of doing so, they produce toxic and corrosive gases. In the case of the combustion of FR-2 laminates, which contain phosphorous compounds, phosphoric acid is formed. CEM-1, CEM-3 and FR4 laminates, which contain brominated epoxy resin, produce corrosive and toxic hydrogen bromide on combustion.

It is well known in the art that aluminum hydroxide may be used to improve the fire retardancy of synthetic polymer systems based on, for example, epoxy, polyester, and vinyl ester, because the polymers decompose in the same temperature range as the aluminum hydroxide. However, the thermal stability of the gibbsite form of aluminum hydroxide [Al(OH)$_3$ or sometimes represented as Al$_2$O$_3$.3H$_2$O] is insufficient at the temperatures used to solder components to a printed circuit board laminate. This can result in blistering of the laminate, thereby rendering it unusable.

It is known that when gibbsite type aluminum hydroxide is heat treated in air, it is partially converted to the monohydrate form, boehmite (AlOOH or Al$_2$O$_3$.H$_2$O), which improves thermal stability but to the detriment of fire retardancy.

Japanese Published Patent Application No. A 60/203438 describes a CEM-3 laminate containing heat treated gibbsite aluminum hydroxide which has improved thermal stability over standard aluminum trihydroxide, but which does not give the required level of fire retardancy so that brominated epoxy resin has to be used to achieve the UL 94 V0 rating. In such circumstances, and in the absence of superior fire properties, other inorganic materials, such as, talc or clay, could also be used.

British Published Patent Application No. 9700708.2 describes superior CEM-3 laminates having good thermal stability, being halogen/phosphorus free and meeting the UL 94 V0 requirement by introducing a thermally stable aluminum hydroxide to the laminate.

However, it has been found that these thermally stable aluminum hydroxides have a tendency to absorb moisture. This moisture significantly reduces solder resistance of the laminates. The thermally stable aluminum hydroxide needs accordingly and optionally to be applied more or less immediately after production. It has been found that the moisture may become firmly bound on the surface with the effect that the techniques commonly applied to remove surface moisture, such as, prior heat treatment at 110° C. or azeotropic removal with the acetone used in the laminating system, may not satisfactorily work.

BROAD DESCRIPTION OF THE INVENTION

An object of the invention is to further improve the application and characteristics of the thermally stable aluminum hydroxide towards a significant lower tendency to absorb moisture. A further object of the invention is to produce a CEM-3 laminate which has good thermal stability, is halogen/phosphorus free, meets the UL 94 V0 requirement and, finally, shows excellent solder and moisture resistance of the laminate produced. These objects have been achieved with the nonhygroscopic thermally stable aluminum hydroxide of the invention, by a method for its preparation, the laminate containing the new and inventive nonhygroscopic thermally stable aluminum hydroxide and with a method for producing the laminate.

The nonhygroscopic thermally stable aluminum hydroxide is characterized in that it has the molecular formula Al$_2$O$_3$.nH$_2$O, wherein n has a value of >2.6 to <2.9, and in that it is surface treated with a silane.

The basis for the nonhygroscopic thermally stable aluminum hydroxide according to the invention is the thermally stable aluminum hydroxide as described in detail in British Published Patent Application No. 9700708.2. This thermally stable aluminum hydroxide can, as described therein, be created by a size reduction of an aluminum hydroxide agglomerate with an average particle size D50% of 40 to 80 μm, preferably of 50 to 70 μm, crystallized out from a typical Bayer process—sodium aluminate solution.

Any size reduction technique, e.g., ball milling, which separates the crystals present within coarser agglomerates with little or no gross fracture of the single crystals can be applied. A simultaneous broadening of the particle size distribution due to attrition and the absence of crystal breakage by gross fracture improves the processability of the thermally stable aluminum hydroxide in the respective resin system.

The subsequent thermal stabilization can be achieved by simply heating the material recovered from the size reduction treatment at a temperature and during a time sufficient to reduce the water loss on ignition from 34.5 weight percent (n=3) to a level corresponding to the n value as mentioned above.

In the molecular formula, Al$_2$O$_3$.nH$_2$O, n preferably has a value of 2.7 to 2.8.

A very essential point is the particle size distribution which combines a relatively fine average size with a breadth of particle sizes. This improves the dispersion of the thermally stable aluminum hydroxide in the resin while at the same time minimizing the tendency of the coarser particles to sediment out during processing and avoiding any filtering effects by the non-woven glass.

An optimum particle size distribution allows minimum viscosity of the resin/filler mix at a filling level sufficiently high to achieve the desired flame retardant properties of the laminate without the need to add any other flame retardants.

The average particle size D50% of the nonhygroscopic thermally stable aluminum hydroxide is 5 to 10 μm. The breadth of the particle size distribution is indicated by the D10% range, i.e., 10 percent by weight of the particles are smaller than 0.5 to 1.5 μm, and the D90% range, i.e., 90 percent by weight of the particles are less than 20 to 35 μm in size.
}

The silane treatment is, as a rule, achieved by first dispersing the thermally stable aluminum hydroxide in a diluent commonly used in the production of laminates for printed circuit boards, preferably a ketone and, most preferably, acetone.

Before the silane is added, it is advantageous to vigorously mix the dispersion with an equipment allowing the application of heavy shearing forces to the mixture like a shearing head mixer or the like.

Thereafter, a suitable silane, preferably in liquid form, is added in such an amount that the content onto the thermally stable aluminum hydroxide ranges between 0.1 and 2 weight percent.

Suitable silanes are commercially available, e.g., from Hüls under the trade name Dynasilan® (Hüls-brochure "Anwendung von organofunktionellen Silanen, Dynasilan®"of October, 1989). The preferred silane is, as a rule, an aminoalkylsilane, an epoxyalkylsilane or a vinylsilane. Particularly well suited to epoxy applications is an aminoalkylsilane.

The resulting nonhygroscopic thermally stable aluminum hydroxide has, after the silane treatment, a hydrophobic surface free of any adsorbed moisture.

As outlined in British Published Patent Application No. 9700708.2, the CEM-3 type laminates are, as a rule, constructed from two layers of woven fiberglass on the outsides and three layers of non-woven glass tissue in the core.

According to the invention, the laminate for printed circuit boards has surface layers comprising curable resin-impregnated woven glass fabric and intermediate layers comprising curable resin-impregnated non-woven glass, and is characterized in that the intermediate layers contain 200 to 275 percent by weight (based on the resin) of a nonhygroscopic thermally stable aluminum hydroxide according to the invention.

The curable resin may be an unsaturated polyester resin, an epoxy, a vinyl ester or any suitable thermosetting compound which on combustion decomposes in the same temperature range as the thermally stable aluminum hydroxide.

The laminates may be based on epoxy resin which allows a batch process to be used. The laminates may also be produced by continuous process using unsaturated polyester or vinyl ester, i.e, resins which polymerize via a free radical mechanism. The nature of the invention, however, does not limit the manufacturing technique for the laminate.

When the production of the laminate is based on epoxy resin, as a rule, two layers of woven glass preimpregnated with the epoxy resin are combined with three layers of non-woven glass preimpregnated with epoxy resin containing thermally stable aluminum hydroxide. These five layers are usually then combined with one or two layers of copper foil on the outside and the assembly is subjected to heat and pressure to polymerize the resin and consolidate the laminate.

Most epoxy resins used for electrical and electronic applications are derived from bisphenol A or cycloaliphatic species. The most common curing agent is dicyandiamide.

According to the method of the invention, the intermediate layer comprising curable resin impregnated non-woven glass contains 200 to 275 percent by weight, preferably 225 to 250 percent by weight, of the nonhygroscopic thermally stable aluminum hydroxide according to the invention.

The incorporation of the nonhygroscopic thermally stable aluminum hydroxide into the curable resin can be accomplished by methods known to those skilled in the art, i.e., usually by introducing the filler—either after its silane treatment according to the invention, in the form of a dispersion in the respective solvent or recovered from the silane treatment and dried, in solid form—into the predissolved mixture of resin and curing agent using suitable equipment such as a shearing head mixer. If needed, other inorganic thermally stable fillers may be added to the formulation, such as, fine silica, clay or talc, although none of these would significantly enhance fire properties.

Further processing of the resin/filler mix to the "prepreg" stage and, then, to the cured laminate is common state of the art and described in the literature, an example of which is "Handbook of Epoxide Resins", published by the McGraw-Hill Book Company.

The cured laminate according to the invention shows further enhanced thermal stability when compared to laminates prepared according to British Published Patent Application No. 9700708.2; when immersed in molten solder at 260° C., it shows no signs of blistering or bubbling for a period of over 90 seconds. The laminate also has excellent fire retardancy characteristics and meets the requirements of UL 94 V-0.

DETAILED DESCRIPTION OF THE INVENTION

EXAMPLE 1

Production of a Thermally Stable Aluminum Hydroxide

Fine crystals of aluminum hydroxide (average size 1 to 2 $\mu$m) are agglomerated to ca. 60 $\mu$m average size by using a seed charge of 50 kg/dm$^3$ sodium aluminate solution of the following concentration: $Na_2O$—140 kg/dm$^3$, $Al_2O_2$—150 kg/dm$^3$, total $Na_2O$—150 kg/dm$^3$. The working capacity of the crystallizer is 1 m$^3$. The crystallization temperature is 75° C. with a retention time of 24 h. The alumina liquor productivity is ca. 40 kg/dm$^3$. The product of crystallization is washed with deionized water and dried at 105° C. for 4 h. Size reduction of the aluminum hydroxide particles is effected by means of a vibration mill (type Palla 200 of the KHD company). The milling conditions are as follows: motor—1000 rpm; loading of cylpebs—ca. 65 percent by volume; Cylpebs dimensions—12 mm×12 mm aluminum oxide; mill throughput ca. 50 kg/h. Under these conditions, the feed aluminum hydroxide is reduced in size to the dimensions given in Table 1. The final step of thermal stabilization is achieved by lowering the water loss on ignition from the 34.5 weight percent of the size reduced material to ca. 31 weight percent by heating in an electric oven operating at a temperature of 220° C. for a time of ca. 2 h. The properties of the thermally stable material are also given in Table 1.

TABLE 1

| Physical Parameter | Value |
|---|---|
| $Al_2O_3 \cdot nH_2O$, "n" | 2.7 |
| Particle size D 10% ($\mu$m) | 1.0 |
| Particle size D 50% ($\mu$m) | 7.5 |
| Particle size D 90% ($\mu$m) | 28.0 |
| Specific Surface Area (m$^2$g) | 6.0 |
| Oil Absorption (ml/100 g) | 28.0 |

EXAMPLE 2

Silane Treatment of the thermally stable aluminum hydroxide of ex. 1

100 g of thermally stable aluminum hydroxide as of Example 1 is dispersed in 500 ml acetone. The mixture is dispersed under a shearing head mixer for 20 minutes. After this time, 0.75 g of an aminoalkylsilane (A1100 of Witco) is added. After further stirring for 5 minutes, the solvent is evaporated and the nonhygroscopic thermally stable aluminum hydroxide is collected having the following characteristics:

TABLE 2

| Physical Parameter | Value |
|---|---|
| $Al_2O_3 \cdot nH_2O$, "n" | 2.7 |
| Particle size D 10% ($\mu$m) | 1.0 |
| Particle size D 50% ($\mu$m) | 7.5 |
| Particle size D 90% ($\mu$m) | 28.0 |
| Specific Surface Area ($m^2$g) | 5.5 |
| Oil Absorption (ml/100 g) | 20.0 |
| Silane content (wt. %) | 0.4 |

EXAMPLE 3

Preparation of the laminate (Batch Process)

100 parts of an epoxy resin with epoxy equivalent of 400 to 500 (DOW DER 652) dissolved in 30 parts of acetone is mixed with 4 parts of dicyandiamide predissolved in 36 parts of 2-methoxy ethanol. To this mix is added 0.1 parts of 2-methyl imidazole to accelerate the resin cure (Mix A). Woven glass fabric (style 7628 manufactured by Interglass) is impregnated with Mix A to a resin content of 42 percent, and the resin is B-staged for 2 min. at 160° C. to produce a dry prepreg. 250 phr of thermally stable aluminum hydroxide as of Example 1 is dispersed in one-third of its weight of acetone. The mixture is dispersed under a shearing head mixer for 20 minutes. After this time, 0.75 weight percent, relative to the amount of thermally stable aluminum hydroxide, of an aminoalkylsilane (A1100 of Witco) is added (Mix B). Separately, to Mix A are added 250 phr (i.e., parts per hundred resin) of (a) the thermally stable aluminum hydroxide and (b) the nonhygroscopic thermally stable aluminum hydroxide according to the invention in the form of Mix B. Both mixes are impregnated into non-woven glass (type E 105 manufactured by Owens Corning) to give weight corresponding to 90 percent of the total. The thermally stable aluminum hydroxide is predispersed in an amount of acetone commensurate with achieving the final mix viscosity. The resin system is, then, B-staged for 3 min. at 160° C. to produce a dry, handleable prepreg. Three of the non-woven glass prepreg layers are sandwiched between two woven glass prepreg layers. This assembly has copper foil placed on both sides and the pack laminated at 180° C. at a pressure of 50 bar for 90 min. to produce a copper clad laminate 1.6 mm thick.

Test Results

Comparison is made between (a) the thermally stable aluminum hydroxide according to British Published Patent Application No. 9700708.2 and (b) the nonhygroscopic thermally stable aluminum hydroxide of the invention. See Table 3 below.

Solder resistance is measured by fully immersing the laminate in molten solder at 260° C. When the aluminum hydroxide starts to decompose, it is possible to hear the laminate blistering and the escaping water causes "waves" at the solder surface. The time is measured until the blistering waves are detected.

The flammability is defined by the American Underwriters Laboratory UL 94 standard which categorizes performance on combustion as V-0 (the best), V-1 and HB (the worst). For pcb applications, laminates have to meet the V-0 category.

TABLE 3

Solder Resistance and Flammability Test Results

| Test | Laminate with thermally stable aluminum hydroxides (ts-ATH) (GB 9700708.2) | | | Laminate with nonhygroscopic thermally stable aluminum hydroxide (invention) |
|---|---|---|---|---|
| Amount (phr) | 250 | 250 | 250 | 250 |
| Time after production of ts-ATH (months) | 1 | 2 | 6 | 6 |
| Solder Resistance(s) | >90 s | 40 s | <20 s | >90 s |
| Flammable UL 94 | V0 | — | — | V0 |

What is claimed is:

1. Nonhygroscopic thermally stable aluminum hydroxide of the molecular formula $Al_2O_3 \cdot nH_2O$, wherein n has a value of >2.6 to <2.9, and which is surface treated with a silane.

2. The nonhygroscopic thermally stable aluminum hydroxide according to claim 1, which has a particle size in the D50% range of 5 to 10 $\mu$m.

3. The nonhygroscopic thermally stable aluminum hydroxide according to claim 2, which has a particle size in the D50% range of 0.5 to 1.5 $\mu$m and in the D90% range of 20 to 35 $\mu$m.

4. The nonhygroscopic thermally stable aluminum hydroxide according to claim 3, wherein the silane is selected from the group consisting of an aminoalkylsilane, an epoxyalkylsilane and a vinylsilane.

5. The nonhygroscopic thermally stable aluminum hydroxide according to claim 4, wherein the silane content on the thermally stable aluminum hydroxide is between 0.1 and 2.0 weight percent.

6. Laminate for printed circuit boards having surface layers comprising resin impregnated woven glass fabric and intermediate layers comprising curable resin impregnated non-woven glass, the intermediate layer containing 200 to 275 percent by weight, based on the resin in the intermediate layer, of a nonhygroscopic thermally stable aluminum hydroxide according to claim 5.

7. The laminate according to claim 6 wherein, as a curable resin, an unsaturated polyester resin, an epoxy or a vinyl ester is applied.

8. Printed circuit board made of the laminate according to claim 6.

9. The nonhygroscopic thermally stable aluminum hydroxide according to claim 1, which has a particle size in the D10% range of 0.5 to 1.5 $\mu$m and in the D90% range of 20 to 35 $\mu$m.

10. The nonhygroscopic thermally stable aluminum hydroxide according to claim 1, wherein the silane is selected from the group consisting of an aminoalkylsilane, an epoxyalkylsilane and a vinylsilane.

11. The nonhygroscopic thermally stable aluminum hydroxide according to claim 1, wherein the silane content on the thermally stable aluminum hydroxide is between 0.1 and 2.0 weight percent.

12. Process for removing the moisture adhered to a thermally stable aluminum hydroxide according to claim 1, comprising treating the thermally stable aluminum hydroxide with a silane in the presence of a ketone as solvent.

13. The process according to claim 12, wherein the silane is selected from the group consisting of an aminoalkylsilane, an epoxyalkylsilane and a vinylsilane.

14. The process according to claim 13, wherein the silane is added in an amount of 0.1 to 2.0 weight percent relating to the thermally stable aluminum hydroxide.

15. The process according to claim 14, wherein acetone is used as solvent.

16. The process according to claim 12, wherein the silane is added in an amount of 0.1 to 2.0 weight percent relating to the thermally stable aluminum hydroxide.

17. The process according to claim 12, wherein acetone is used as solvent.

18. Laminate for printed circuit boards having surface layers comprising resin impregnated woven glass fabric and intermediate layers comprising curable resin impregnated non-woven glass, the intermediate layer containing 200 to 275 percent by weight, based on the resin in the intermediate layer, of the nonhygroscopic thermally stable aluminum hydroxide according to claim 1.

19. The laminate according to claim 18, wherein, as a curable resin, an unsaturated polyester resin, an epoxy or a vinyl ester is applied.

20. Printed circuit board made of the laminate according to claim 18.

21. Method for the preparation of a laminate for printed circuit boards by composing together surface layers comprising curable resin impregnated woven glass fabric and intermediate layers comprising curable resin-impregnated non-woven glass, the curable resin-impregnated non-woven glass containing 200 to 275 percent by weight, based on the resin in the intermediate layers, of the nonhygroscopic thermally stable aluminum hydroxide according to claim 1.

22. The method according to claim 21, wherein, as a curable resin, an unsaturated polyester resin, an epoxy or a vinyl ester is applied.

23. The method according to claim 22, wherein the nonhygroscopic thermally stable aluminum hydroxide is either added in the form of a dispersion in a ketone to the curable resin-impregnated non-woven glass just after its production according to claim 9 or dried in solid form.

24. The method according to claim 21, wherein the nonhygroscopic thermally stable aluminum hydroxide is either added in the form of a dispersion in a ketone to the curable resin-impregnated non woven glass just after its production according to claim 9 or dried in solid form.

25. Printed circuit board prepared by the method according to claim 24.

26. Printed circuit board prepared by the method according to claim 21.

27. A composition consisting of a nonhygroscopic thermally stable aluminum hydroxide of molecular formula $Al_2O_3 \cdot nH_2O$, wherein n has a value of >2.6 to <2.9, and a silane, with which the aluminum hydroxide has been surface treated.

* * * * *